(12) United States Patent
Nussbaum

(10) Patent No.: US 8,243,960 B2
(45) Date of Patent: Aug. 14, 2012

(54) PLANAR AUDIO AMPLIFIER OUTPUT INDUCTOR WITH CURRENT SENSE

(75) Inventor: Michael Nussbaum, Newton, MA (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 12/717,208

(22) Filed: Mar. 4, 2010

(65) Prior Publication Data
US 2011/0215893 A1 Sep. 8, 2011

(51) Int. Cl.
*H03F 99/00* (2009.01)
*H02B 1/00* (2006.01)
*H04R 1/00* (2006.01)
*H01F 27/24* (2006.01)
*H01F 27/28* (2006.01)
*H01F 17/04* (2006.01)

(52) U.S. Cl. ........ 381/120; 381/123; 381/409; 381/410; 381/412; 336/232; 336/170; 336/212; 336/221

(58) Field of Classification Search .................. 336/232, 336/170, 222, 223, 173, 178, 192, 212, 221; 381/57, 120, 161, 409, 410, 412
See application file for complete search history.

(56) References Cited

U.S. PATENT DOCUMENTS

| | | | | |
|---|---|---|---|---|
| 4,253,079 A * | 2/1981 | Brosh | ........................... | 336/84 C |
| 5,319,342 A * | 6/1994 | Kuroki | ........................... | 336/170 |
| 5,982,264 A * | 11/1999 | Nakao et al. | .................. | 336/200 |
| 6,369,685 B1 * | 4/2002 | Milavec et al. | ................ | 336/232 |
| 6,628,531 B2 | 9/2003 | Dadafshar | | |
| 6,914,508 B2 * | 7/2005 | Ferencz et al. | ................ | 336/200 |
| 7,332,993 B1 | 2/2008 | Nussbaum | | |
| 7,432,793 B2 | 10/2008 | Nussbaum | | |
| 7,889,041 B2 * | 2/2011 | Minteer | ........................ | 336/200 |
| 2002/0070835 A1 * | 6/2002 | Dadafshar | ..................... | 336/200 |
| 2004/0028242 A1 * | 2/2004 | Kitamura | ......................... | 381/96 |
| 2004/0174241 A1 * | 9/2004 | He et al. | ......................... | 336/200 |
| 2007/0139151 A1 * | 6/2007 | Nussbaum | ..................... | 336/200 |
| 2007/0159289 A1 * | 7/2007 | Lee et al. | ....................... | 336/212 |
| 2008/0192960 A1 * | 8/2008 | Nussbaum et al. | ........... | 381/120 |
| 2009/0041266 A1 * | 2/2009 | Guo et al. | ......................... | 381/98 |
| 2010/0219926 A1 * | 9/2010 | Willers et al. | ................. | 336/200 |

FOREIGN PATENT DOCUMENTS

| | | |
|---|---|---|
| DE | 102007019110 A1 | 10/2008 |
| GB | 2250383 A | 6/1992 |
| GB | 2351620 A | 1/2001 |

OTHER PUBLICATIONS

International Search Report and Written Opinion dated May 18, 2011 for Int. Appln. No. PCT/US2011/024675.

\* cited by examiner

*Primary Examiner* — Mohamad Musleh
*Assistant Examiner* — Mangtin Lian
(74) *Attorney, Agent, or Firm* — Bose Corporation

(57) ABSTRACT

An audio amplifier, that includes a planar inductor structure that includes a first plurality of windings, formed on layers of a first circuit board and a second plurality of windings, formed on layers of a second circuit board. The planar inductor structure may further include a sense winding.

7 Claims, 6 Drawing Sheets

US 8,243,960 B2

PLANAR AUDIO AMPLIFIER OUTPUT INDUCTOR WITH CURRENT SENSE

BACKGROUND

This specification describes a planar audio amplifier output inductor with current sense. Reference is made to U.S. Pat. No. 7,432,793, incorporated herein by reference in its entirety.

SUMMARY

In one aspect an audio amplifier, includes a planar inductor structure that includes a first plurality of windings, formed on layers of a first circuit board and a second plurality of windings, formed on layers of a second circuit board. The audio may further include an output stage and a switching stage. The first plurality of windings may be adjacent the output stage and the second plurality of windings may be adjacent the switching stage. The first plurality of windings may be separated from the second plurality of windings by a spacing structure having a thickness. An inductive coupling constant K may be proportional to the thickness. The spacing structure may include layers of dielectric material. The spacing structure may include interconnect pins. The first plurality of windings and the second plurality of windings may be characterized by a coupling constant K, which may be proportional to the thickness of the spacing structure. The planar output inductor may further includes a ferrite core structure substantially enclosing the first plurality of windings and the second plurality of windings. The ferrite core may include two opposing faces separated by a gap having a width. The inductance of the output inductor may be proportional to the width of the gap. The audio amplifier of claim may further include a first core structure, including ferrite and a second core structure, includes a material having a magnetic permeability μ in the range of 4 to 200. The first structure and the second structure may be configured so that they form a combined structure having cavities that accommodate the first plurality and the second plurality of windings, wherein the inductance of the output inductor is proportional to μ. The audio amplifier may further include a sense coil, sensing the current in the inductor, formed on a layer of the first circuit board, adjacent one of the first plurality of windings.

In another aspect, an audio amplifier, includes a planar inductor structure that includes a first plurality windings formed on layers of a first circuit board and a sense coil, sensing the current in the first plurality of windings, adjacent the one of the first plurality of windings. The planar inductor structure may further include a second plurality of windings, formed on layers of a second circuit board.

Other features, objects, and advantages will become apparent from the following detailed description, when read in connection with the following drawing, in which:

Figure 6A:
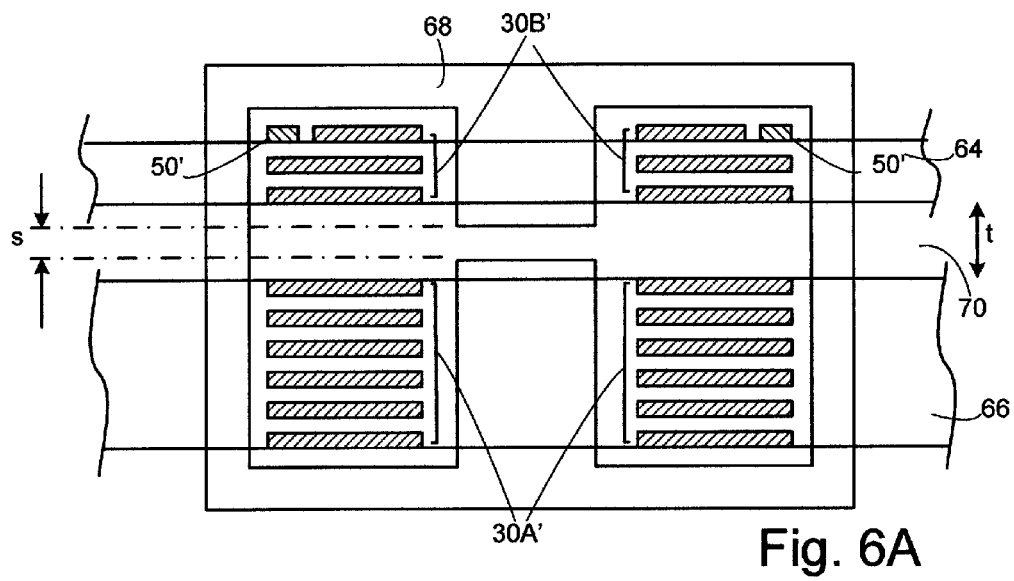
Figure 6B:
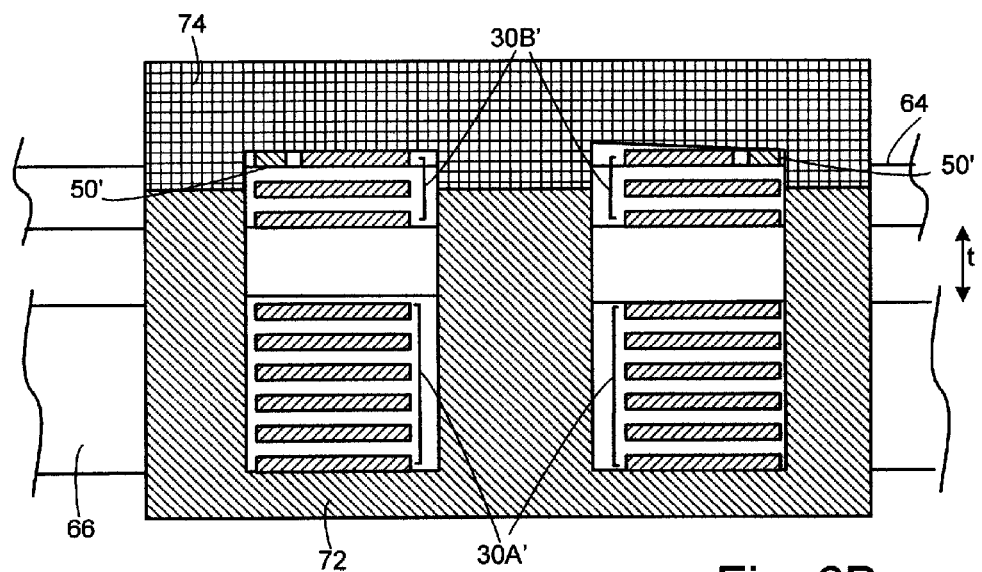
Figure 7:
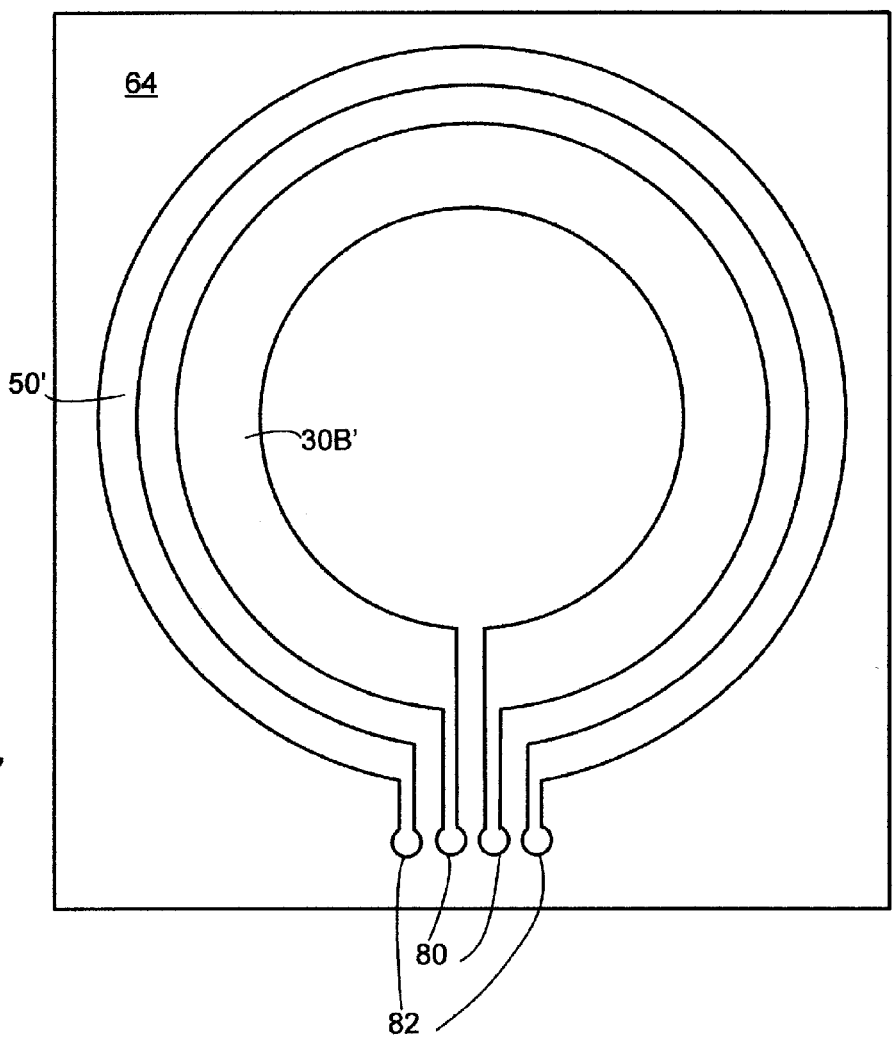

showing the effect of the a coupling coefficient;

FIGS. 6A and 6B are diagrammatic cross-sections of planar inductors with current sensing loops; and FIG. 7 is a top plan view of an inductor and a sense coil.

DETAILED DESCRIPTION

Though the elements of several views of the drawing may be shown and described as discrete elements in a block diagram and may be referred to as "circuitry", unless otherwise indicated, the elements may be implemented as one of, or a combination of, analog circuitry, digital circuitry, or one or more microprocessors executing software instructions. The software instructions may include digital signal processing (DSP) instructions. Operations may be performed by analog circuitry or by a microprocessor executing software that performs the mathematical or logical equivalent to the analog operation. Unless otherwise indicated, signal lines may be implemented as discrete analog or digital signal lines, as a single discrete digital signal line with appropriate signal processing to process separate streams of audio signals, or as elements of a wireless communication system. Some of the processes may be described in block diagrams. The activities that are performed in each block may be performed by one element or by a plurality of elements, and may be separated in time. The elements that perform the activities of a block may be physically separated. Unless otherwise indicated, audio signals or video signals or both may be encoded and transmitted in either digital or analog form; conventional digital-to-analog or analog-to-digital converters may not be shown in the figures.

Figure 1:
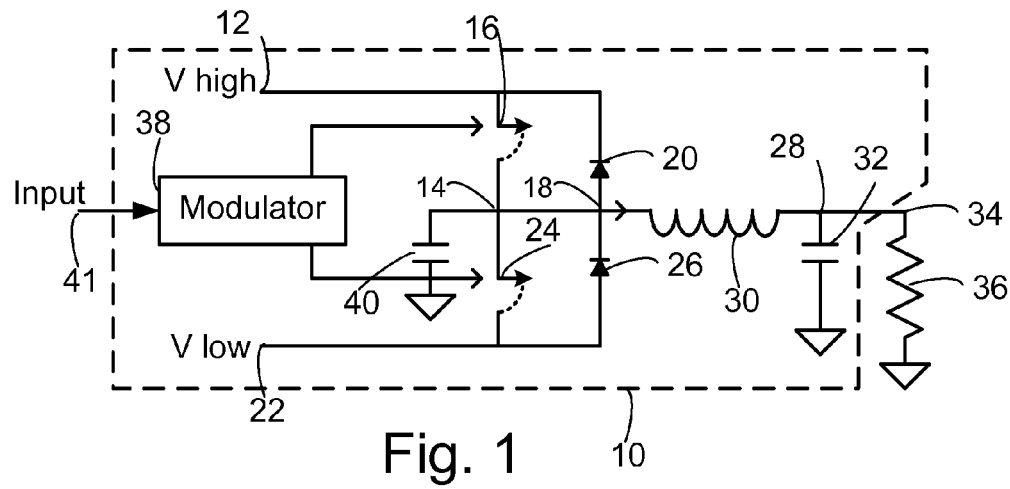
FIGS. 1, 2, 3, and 4A are block diagrams of class D amplifiers.

FIG. 1 shows a class D amplifier 10. $V_{high}$ voltage source 12 is coupled to switching node 14 by switch 16 and to node 18 by diode 20. $V_{low}$ voltage source 22 is coupled to switching node 14 by switch 24 and to node 18 by diode 26. Switching node 14 may be coupled to ground through capacitance 40 (which does not necessarily represent a component capacitor and may be parasitic capacitance, for example from field effect transistors [FETs] that perform the function of the switches 16 and 24 and the diodes 20 and 26) and to node 18. Node 18 is coupled to node 28 by inductor 30. Node 28 is coupled to ground by output capacitor 32 and is coupled to output terminal 34. Output terminal 34 is coupled to load 36. Modulator 38 is operatively coupled to switches 16 and 24 to control switches 16 and 24.

The inductor 30 and the capacitor 32 form an output filter. Switching amplifiers generally utilize an output filter to prevent switching frequencies and their harmonics from radiating and causing electromagnetic interference (EMI) with other equipment.

In operation switches 16 and 24 are closed and opened by the modulator 38 in accordance with a switching cycle. Switch 16 is closed connecting the load through inductor 30 to a voltage source ($V_{high}$) 12 higher than the highest required load voltage for an interval, at the end of which switch 16 is opened and switch 24 is closed connecting the load through inductor 30 to a voltage source ($V_{low}$) 22 lower than the lowest required load voltage for another interval, at which point switch 24 opens and switch 16 is closed again. The voltage at the load will average to a value between $V_{low}$ and $V_{high}$ in proportion to the relative "on" time of the two switches. That proportion (the "duty cycle") is varied substantially continuously by the modulator with the goal to produce the desired output voltage. The inductor current (referenced in the outward direction) will change positively when switch 16 is on and change negatively when switch 24 is on and will average to the output current, with the switching cycle variation termed the "ripple current". For the most part, the ripple current will flow through the output capacitor 32, and the average inductor current will equal the current in the load.

Figure 2:
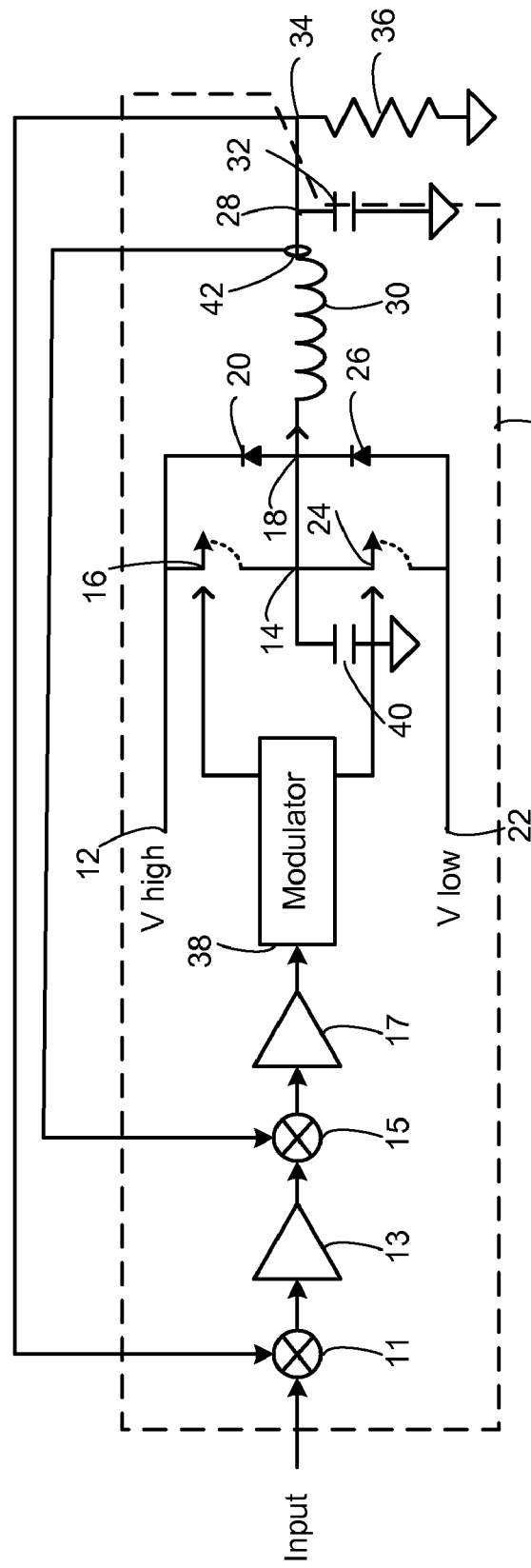

For a variety of reasons, including mitigating distortion caused by the output filter including inductor 30 and capacitor 32, it is desirable to close a feedback loop around the output voltage after the filter at the load. As this filter is a second order system and there exist other delays and contributors to phase lag in the amplifier control system, this requires additional compensation to give a stable system. One way to do this is shown in FIG. 2. The amplifier of FIG. 2 includes an outer voltage loop in which the voltage at the output terminal 34 is fed back to a voltage feedback circuit including an voltage loop summer 11 and a voltage loop compensator 13. In addition an inner current loop, including a current sensor 42 that senses the current in the inductor 30, a current loop summer 15, and a current loop compensator 17 operates on the output of the outer voltage loop to stabilize the outer voltage loop. This current loop preferably includes a high bandwidth, low noise method to sense the current in the output inductor. For reasons that will be explained later, it may be desirable to place the current sensor 42 at the output stage end of the inductor 30; however, the current sensor may be positioned at any convenient point.

One high bandwidth AC current sensor is based on integrating the voltage across the output inductor 30. Starting with $$V[t] = L\frac{di[t]}{dt}, \text{ then}$$

$$\frac{1}{L}\int V[t]\,dt = i[t] + c$$

Figure 3:
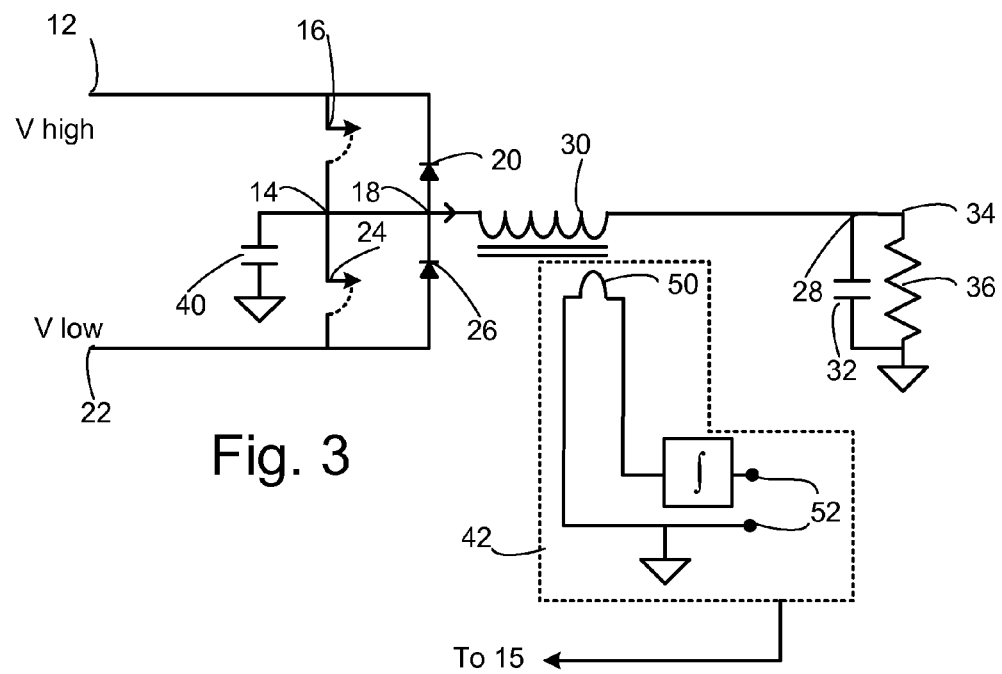

Therefore, the current sensor 42 of FIG. 2 can be implemented as shown in FIG. 3. The current sensor 42 includes a sense winding 50 that is inductively coupled to output inductor 30 and is electrically coupled to output terminals 52 through integrator 53, so that the current in the output inductor 30 can be derived from the output at terminals 52. The derived current can then be provided to the current loop summer 15 of FIG. 2. This current sensor is intended for AC only and is not intended for DC.

Figure 4A:
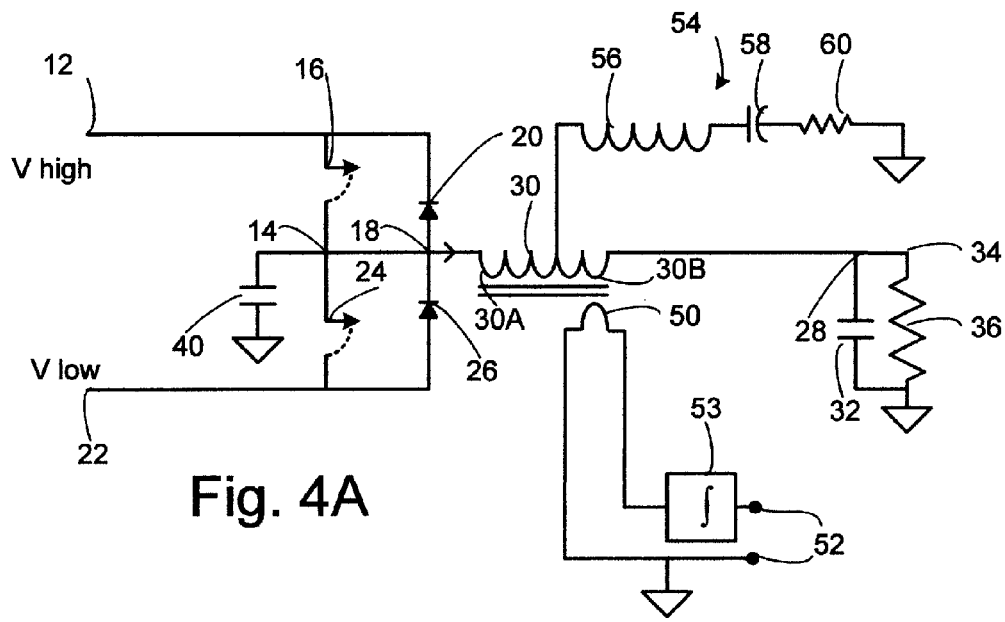

FIG. 4A shows the output portion of a class D amplifier with an additional feature. The amplifier of FIG. 4A additionally includes a tuned network 54 (including an inductor 56, a capacitor 58, and a resistance 60, in series) connected to a tap on the output inductor, as shown, for example, as in FIG. 8 of U.S. Pat. No. 7,432,793, in which the resistance 60 of FIG. 4A is a parasitic resistance. The advantage of the tuned network 54 will be explained below in the discussion of FIG. 5. An amplifier with the configuration of FIG. 4A may have some disadvantages if the tuned network inductor 56 is implemented as a conventional wound magnetic structure. Disadvantages may include coupling capacitance between the sense winding and the windings of the output inductor 30; difficulty in tuning of the resonant network because the tuning is strongly affected by the magnetic coupling coefficient K between the two parts 30A and 30B of the output inductor 30; extra cost resulting from additional windings, taps, and pins; and mechanical problems and variability associated with multiple windings in an inductor with very different numbers of turns and wire gauge.

The coupling capacitance problem can be explained with reference to FIG. 4B, which is the output portion of the class D amplifier of FIG. 4A, in which an additional capacitor 62 (representing the parasitic coupling capacitance between the sense winding 50 and the output inductor 30), has been added between the outputs of switches 16 and 24 and the input to the integrator in the current sense circuit. This coupling capacitance injects an error term. This error term, integrated by the current sense circuit, results in a term proportional to amplifier output voltage summed into the sensor's output. Insofar as we are relying on the sensor to give a clean image of amplifier output current, this is undesirable.

If the two parts 30A and 30B of the output inductor 30 are expressed as two inductors coupled by a coupling coefficient K, $V_{in}$ represents the voltage at node 64, and $V_{out}$ represents the voltage at output terminal 34, then $$\frac{V_{out}}{V_{in}}$$

is strongly affected by the value of the coupling coefficient K.

Figure 5:
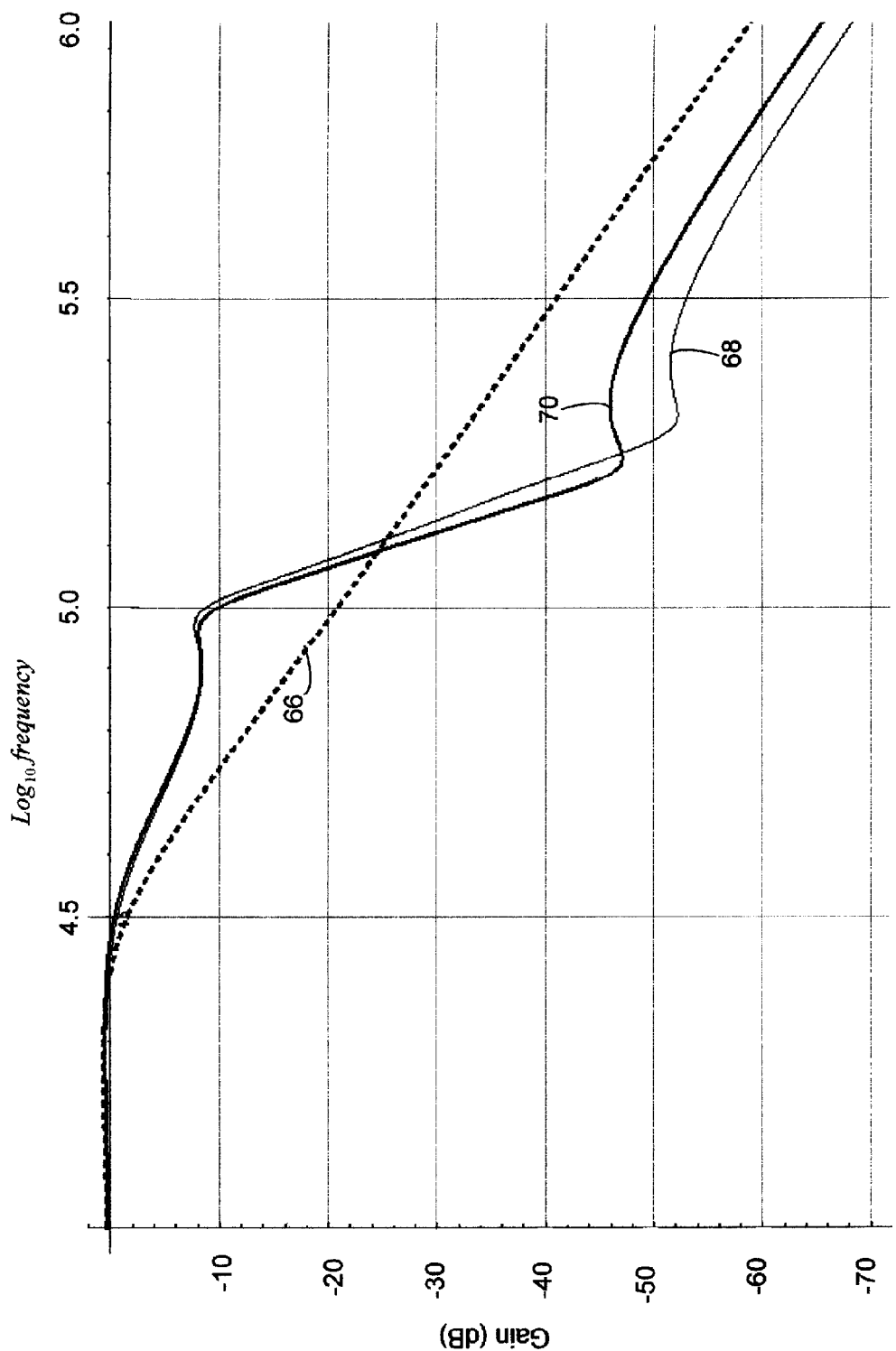
FIG. 5 is a plot of $$\frac{V_{out}}{V_{in}}$$

FIG. 5 shows the frequency response of $$\frac{V_{out}}{V_{in}}.$$

Curve 66 represents the frequency response without tuned network 54. Curve 68 represents the frequency response with the tuned network 54 and a coupling coefficient K of 0.99. Curve 70 represents the frequency response with the tuned network 54 and a coupling coefficient K of 0.9. It can be seen that a change of only 10% in the parameter K results in a system response difference of about 6 dB.

Figure 4B:
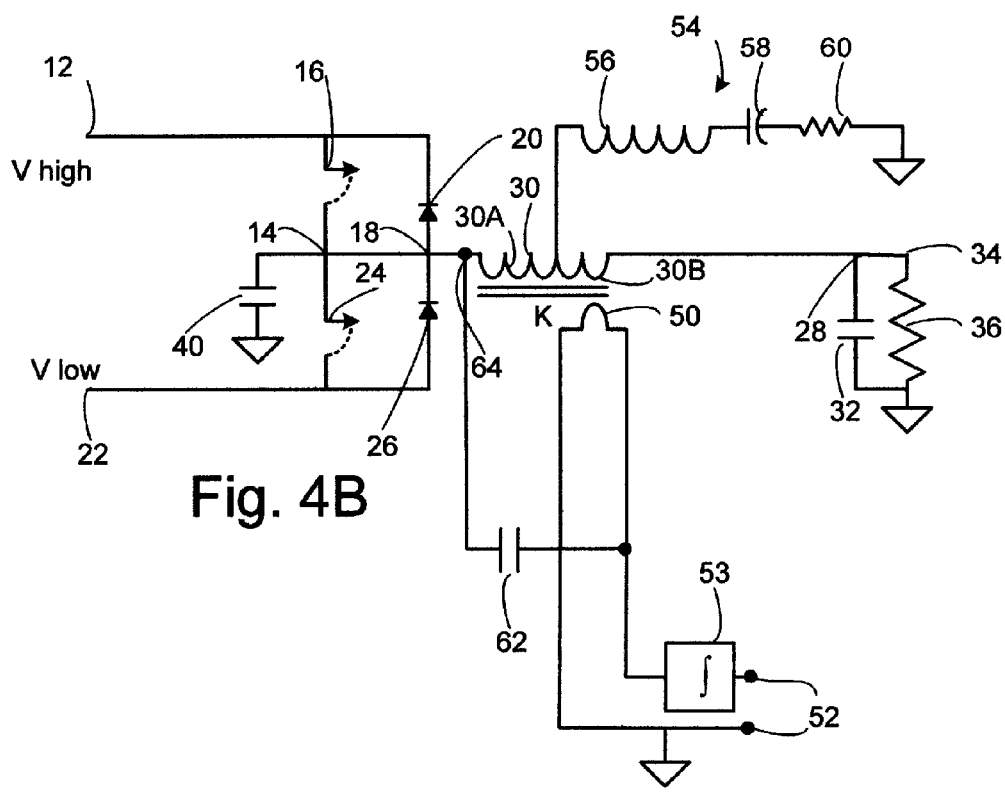
FIG. 4B is a block diagram of a class D amplifier illustrating the effect of coupling capacitance.

FIG. 6A shows a cross-section of a planar inductor that provides a very repeatable coupling coefficient K and that reduces the effect of the parasitic capacitance represented by capacitor 62 of FIG. 4B. Reference numbers with the prime (') indicator represent the physical implementation of the circuit element with the corresponding reference numbers in the previous figures. Inductor part 30A' represents the "noisy" part of the inductor, that is, the part of the inductor that includes the end (the "noisy end") of the inductor adjacent the switches 18 and 24 of previous figures. Inductor part 30W represents the "quiet" part of the inductor, that is, the part of the inductor that includes the end ("the quiet end") of the inductor adjacent the output stage. The quiet part 30W of the inductor is formed on layers of the main printed circuit board (pcb) 64, that is, the part of the printed circuit board on which other components are mounted and within which the interconnections to other circuit elements are formed. The noisy part 30A of the inductor is formed on layers of an extra pcb structure 66 which is spaced away from the main pcb 64 by a spacer 70, with a thickness t, for example, of 0.2 mm. The spacing can be accomplished by dielectric layers in or on the main pcb 64, with interconnect pins, or in other ways. The spacing 70 provides a repeatable coupling coefficient K between parts 30A and 30B of the inductor. The amount of coupling varies inversely with the thickness of the spacing 70, and can be tailored for the specific coupling desired. The winding 50' that generates the current sense signal is positioned on top of the main pcb 64 and is shielded from the "noisy" part of the inductor by the inductor turns. The parasitic capacitance represented by capacitor 62 of FIG. 4B is less than it would be with conventional configurations. The ferrite core 68 is described in U.S. Pat. No. 7,432,793. In the implementation of FIG. 6A, the inductance of the planar inductor is determined by the distance s between the two facing surfaces of the ferrite core.

FIG. 6B shows a cross-section of another implementation of a planar inductor that provides a very repeatable coupling coefficient K and that reduces the effect of the parasitic capacitance represented by capacitor 62 of FIG. 4B. The implementation of FIG. 6B is similar to the structure of FIG. 6A, except that the ferrite core 68 of FIG. 6A is replaced by a core structure having a first portion 72 and a second portion 74. The first portion 72 is a ferrite structure, and the second portion 74 includes a low magnetic permeability material having a magnetic permeability μ in the range of 4 to 200. One suitable material is a class of micron scale iron oxide powders in an insulating matrix available commercially from Micrometals Inc. of Anaheim, Calif., USA. The first portion 72 and the second portion 74 are configured so that they can be mated to form a core structure having a cavity that accommodates the noisy inductor part 30A' and the quiet inductor part 30B' and the sense coil 50'. The first portion 72 and the second portion 74 are further configured so that when mated, the first portion 72 at least partially encloses noisy inductor part 30A' and so that the second portion at least partially encloses quiet inductor part 30B'. The first portion 72 and the second portion are mated so that the distance s is zero. In the configuration of FIG. 6B, the inductance is determined by the magnetic permeability μ of the magnetic material of the second portion 74. Other configurations are possible. For example, the first portion 72 could include the low magnetic permeability material and the second portion could include the ferrite core.

FIG. 7 is a top plan view of a planar inductor with a sense coil without the ferrite core 68 of FIG. 6A or the core structure 72, 74 of FIG. 6B. The reference numbers in FIG. 7 refer to like numbered elements in previous figures. In an actual implementation, main pcb 64 would be typically be significantly larger relative to the inductor and have many other components mounted on it. Interconnect pads 80 are for connecting an inductor coil to other circuit elements or to vias to interconnect the inductor coil to inductor coils on other layers of the pcb, in a manner as described in U.S. Pat. No. 7,432,793. Interconnect pads 82 are for connecting the sense coil 50' to other circuit elements.

Numerous uses of and departures from the specific apparatus and techniques disclosed herein may be made without departing from the inventive concepts. Consequently, the invention is to be construed as embracing each and every novel feature and novel combination of features disclosed herein and limited only by the spirit and scope of the appended claims.

What is claimed is:

1. An electronic device comprising:
an audio amplifier, comprising;
a planar inductor structure comprising:
a first plurality of windings, formed on layers of a first circuit board, the first plurality of windings adjacent an output stage of the audio amplifier;
a second plurality of windings, formed on layers of a second circuit board, the second plurality of windings adjacent a switching stage of the audio amplifier;
a first core structure, comprising a material having a magnetic permeability μ in the range of 4 to 200 substantially enclosing the first plurality of windings; and
a second core structure, comprising ferrite substantially enclosing the second plurality of windings;
the first structure and the second structure configured so that they form a combined structure having cavities that accommodate the first plurality and the second plurality of windings, wherein the inductance of the inductor is proportional to μ.

2. The electronic device of claim 1, wherein the first plurality of windings are separated from the second plurality of windings by a spacing structure having a thickness and wherein an inductive coupling constant K between the first plurality of windings and the second plurality of windings is proportional to the thickness.

3. The electronic device of claim 2, wherein the spacing structure comprises layers of dielectric material.

4. The electronic device of claim 2, wherein the spacing structure comprises interconnect pins.

5. The electronic device of claim 2, the first plurality of windings and the second plurality of windings characterized by a coupling constant K, wherein K is proportional to the thickness of the spacing structure.

6. The electronic device of claim 1, the planar output inductor further comprising a ferrite core structure substantially enclosing the first plurality of windings and the second plurality of windings, the core structure comprising two opposing faces separated by a gap having a width, wherein the inductance of the output inductor is proportional to the width of the gap.

7. The electronic device of claim 1, further comprising:
a sense coil, sensing the current in the inductor, formed on a layer of the first circuit board, adjacent one of the first plurality of windings.

* * * * *